(12) United States Patent
Tsubaki (10) Patent No.: US 12,074,513 B2
(45) Date of Patent: Aug. 27, 2024

(54) POWER CONVERSION DEVICE (71) Applicant: Mitsubishi Electric Corporation, Tokyo (JP)

(72) Inventor: Yusuke Tsubaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 17/564,313

(22) Filed: Dec. 29, 2021

(65) Prior Publication Data
US 2022/0337155 A1 Oct. 20, 2022

(30) Foreign Application Priority Data

Apr. 15, 2021 (JP) ................. 2021-068795

(51) Int. Cl.
*H05K 1/02* (2006.01)
*H01L 25/11* (2006.01)
(Continued)

(52) U.S. Cl.
CPC ........... *H02M 3/003* (2021.05); *H01L 25/115* (2013.01); *H02M 3/33523* (2013.01); *H05K 1/181* (2013.01)

(58) Field of Classification Search
CPC ...... H05K 1/02; H05K 1/0209; H05K 1/0263; H05K 1/0265; H05K 1/0296; H05K 1/181;
(Continued)

(56) References Cited

U.S. PATENT DOCUMENTS

2005/0047044 A1* 3/2005 Nolden ................. H02M 7/003
361/103
2008/0164831 A1* 7/2008 Miller ................ H05K 7/14324
318/445
(Continued)

FOREIGN PATENT DOCUMENTS

EP 3 518 413 A1 7/2019
JP 2000-208686 A 7/2000
(Continued)

OTHER PUBLICATIONS

Office Action dated Jun. 28, 2022 issued by the Japanese Patent Office in Japanese Application No. 2021-068795.

*Primary Examiner* — Xiaoliang Chen
(74) *Attorney, Agent, or Firm* — Sughrue Mion, PLLC; Richard C. Turner (57) ABSTRACT A power conversion device includes: semiconductor switching elements; a housing on which the semiconductor switching elements are fixed; a circuit board on which a driving circuit for driving the semiconductor switching elements is mounted and which is located opposite to and spaced apart from a fixing surface; insertion guides which are disposed on an opposing surface of the circuit board relative to the fixing surface; and elongated terminal extension members each having a length that is matched with a height of a pulse transformer, one ends of which are bonded to respective lead terminals, and the other ends of which extend toward the insertion guides; wherein the pulse transformer is disposed on the opposing surface so as to be opposite to major surfaces of the semiconductor switching elements.

11 Claims, 4 Drawing Sheets (51) Int. Cl.
  *H02M 1/06* (2006.01)
  *H02M 1/08* (2006.01)
  *H02M 1/096* (2006.01)
  *H02M 3/00* (2006.01)
  *H02M 3/335* (2006.01)
  *H05K 1/18* (2006.01)

(58) Field of Classification Search
  CPC .. H05K 1/182; H02M 1/0006; H02M 1/0009; H02M 1/0048; H02M 1/08; H02M 1/096; H02M 1/44; H02M 3/0003; H02M 3/33523; H02M 3/33571; H02M 3/33573; H02M 7/0003; H01L 25/115; B06L 15/007; B06L 50/16; B06L 50/61
  USPC ............... 361/784, 103, 760; 363/132, 178; 318/245, 441, 445, 722; 333/181
  See application file for complete search history.

(56) References Cited

U.S. PATENT DOCUMENTS

| | | | |
|---|---|---|---|
| 2012/0286717 A1* | 11/2012 | Fukuta | B60L 50/61 |
| | | | 318/722 |
| 2015/0029759 A1 | 1/2015 | Takemoto et al. | |
| 2016/0020443 A1* | 1/2016 | White | B25F 5/00 |
| | | | 318/245 |
| 2019/0206565 A1* | 7/2019 | Shelton, IV | A61B 90/90 |
| 2019/0208672 A1 | 7/2019 | Yamabe et al. | |
| 2021/0376740 A1* | 12/2021 | Hayase | H02M 3/33571 |

FOREIGN PATENT DOCUMENTS

| | | |
|---|---|---|
| JP | 2005-123328 A | 5/2005 |
| JP | 2010-80804 A | 4/2010 |
| JP | 2013-21799 A | 1/2013 |
| JP | 2014-39384 A | 2/2014 |
| JP | 2015-43683 A | 3/2015 |
| JP | 2020-14339 A | 1/2020 |
| WO | 2018055668 A1 | 3/2018 |

\* cited by examiner

POWER CONVERSION DEVICE

BACKGROUND OF THE INVENTION

1. Field of the Invention

The present application relates to a power conversion device.

2. Description of the Background Art

In electric vehicles such as battery electric vehicles, hybrid electric vehicles in which motors are used as driving sources, multiple power conversion devices are mounted. Examples of the power conversion devices include a battery charger for converting AC power from an AC power supply into DC power and then charging a driving battery with that power, and an inverter for converting DC power from the battery into AC power for driving the motor. Further examples of which include a DC-DC converter, etc. for converting a high voltage of the driving battery into a low voltage (for example, 12V) so as to be accommodated with a battery for auxiliary devices.

Recently, in order to achieve cost reduction and weight reduction of the power conversion device and also to reduce the mounting space thereof in the electric vehicle, it is required that the inverter and the DC-DC converter be integrated into one unit. In this regard, there is a technique in which, in order to simplify the configuration of the DC-DC converter and to achieve downsizing thereof, a driving circuit including a pulse transformer and a driving IC is used as a means for driving semiconductor switching elements to be turned ON/OFF (see, for example, Patent Document 1).

In the case where, to the above technique, another technique is applied in which the semiconductor switching elements are fixed to a housing and the housing is employed as a heat dissipation plate (see, for example, Patent Document 2), it is desirable that, in order to make it easier to establish electrical connections between the semiconductor switching elements and the driving circuit, insertion guides for guiding the lead terminals of the semiconductor switching elements be provided on a circuit board on which the driving circuit is mounted.

Patent Document 1: Japanese Patent Application Laid-open No. 2020-14339 (Paragraphs 0014 to 0050; FIG. 1 to FIG. 7)

Patent Document 2: International Publication No. WO 2018/055668 (Paragraphs 0012 to 0018; FIG. 1 to FIG. 3)

However, according to such a power conversion device, a gap corresponding to a height of the insertion guide is required to be created between the semiconductor switching elements and the circuit board, so that an unwanted space is produced between the semiconductor switching elements and the circuit board. Thus, it is conceivable, from the viewpoint of downsizing, to effectively utilize the unwanted space by locating the driving circuit in that space between the semiconductor switching elements and the circuit board. However, the pulse transformer, which is higher than the insertion guide, cannot be stored in the space because of restriction by the lead terminals of the semiconductor switching elements, and is thus required to be mounted on a surface of the circuit board on its side reverse to the insertion guides, resulting in even more bulky configuration.

SUMMARY OF THE INVENTION

This application discloses a technique for solving such a problem as described above, and an object thereof is to provide a power conversion device which has ease of assembly and can be downsized.

A power conversion device disclosed in this application is characterized by comprising: semiconductor switching elements each forming a plate shape, which are paired to form a bridge for power conversion; a housing having a fixing surface to which one of major surfaces of each of the semiconductor switching elements is fixed; a circuit board on which a driving circuit for driving the semiconductor switching elements is mounted and which is located opposite to and spaced apart from the fixing surface; insertion guides which are disposed on an opposing surface of the circuit board relative to the fixing surface; and elongated terminal extension members each having a length that is matched with a height of a pulse transformer that serves to form the driving circuit, one ends of which are bonded to respective lead terminals of the semiconductor switching elements that are projecting from one lateral sides thereof, and the other ends of which extend toward the insertion guides; wherein the pulse transformer is disposed on the opposing surface so as to be opposite to the other one of the major surfaces of each of the semiconductor switching elements.

According to the power conversion device disclosed in this application, since the pulse transformer can be located between the semiconductor switching elements and the circuit board, it is possible to provide a power conversion device which has ease of assembly and can be downsized.

DETAILED DESCRIPTION OF THE EMBODIMENTS OF THE INVENTION

Embodiment 1

Figure 1A:
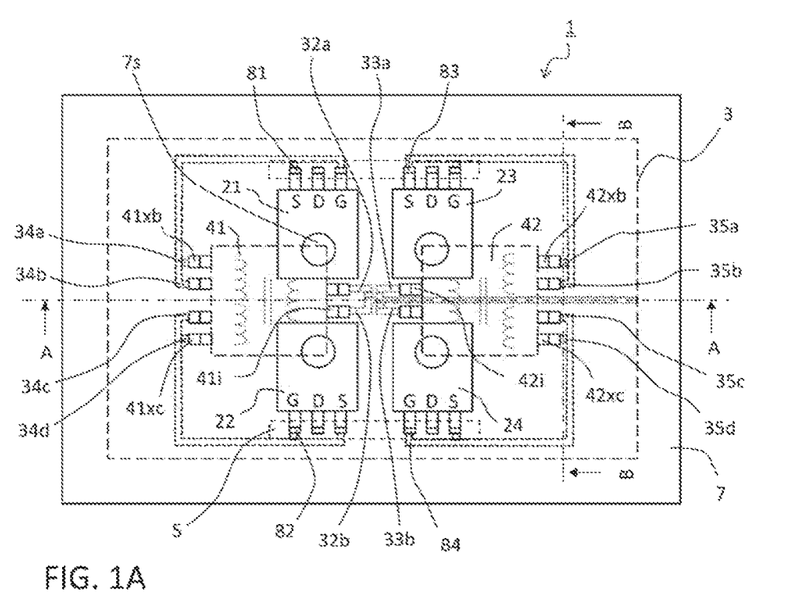
FIG. 1A and FIG. 1B are a plan view and a sectional view for illustrating a configuration of a power conversion device according to Embodiment 1.
Figure 1B:
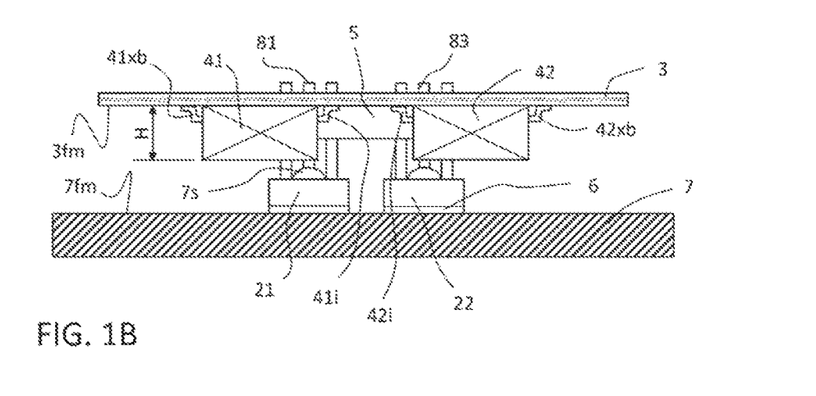
Figure 2A:
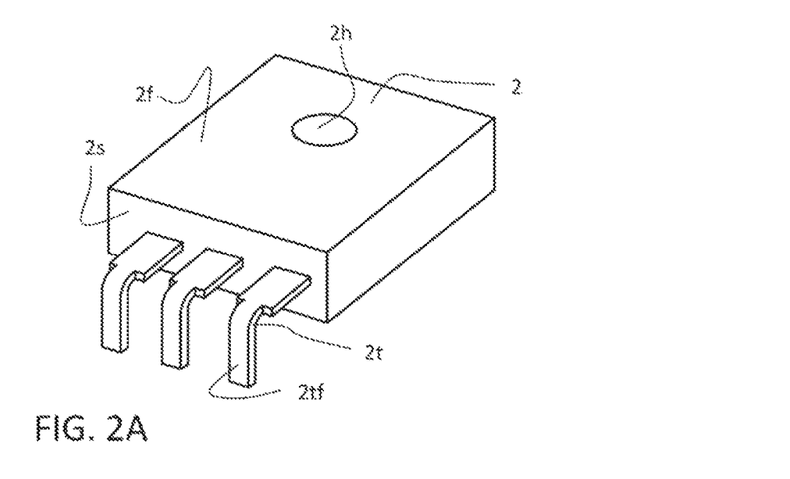
FIG. 2A and FIG. 2B & FIG. 2C are, respectively, perspective views of a semiconductor switching element and two types of terminal extension members having different shapes, for constituting the power conversion device according to Embodiment 1.
Figure 2B:
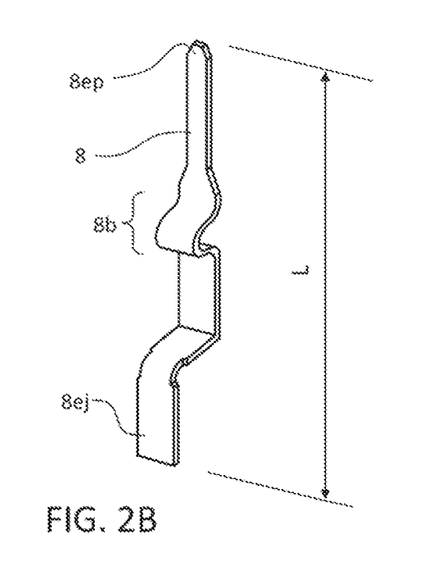
Figure 2C:
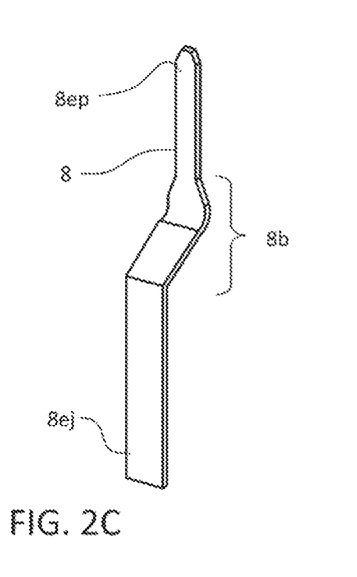
Figure 3:
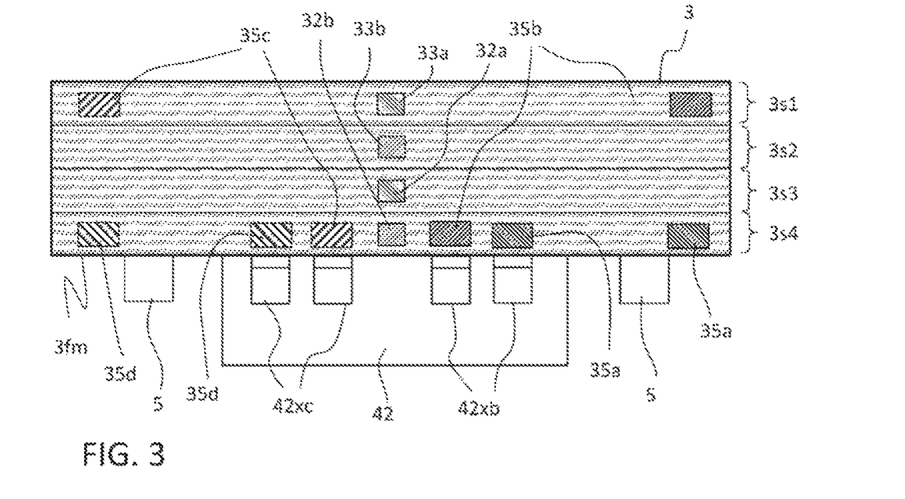
FIG. 3 is a sectional view of a part of a circuit board for constituting the power conversion device according to Embodiment 1.
Figure 4:
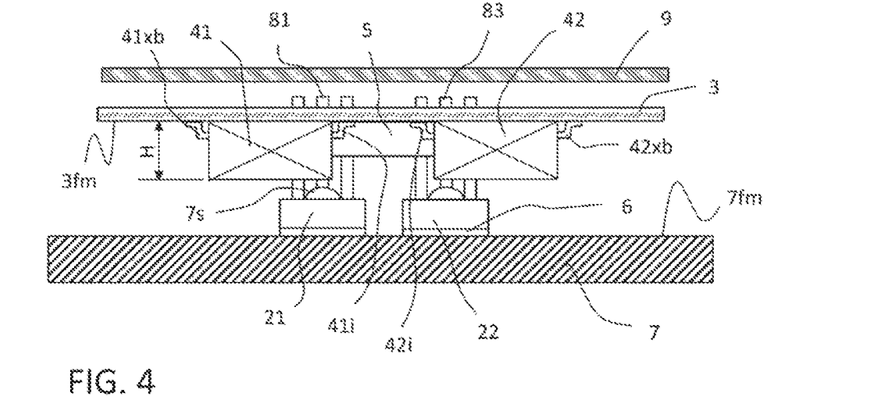
FIG. 4 is a sectional view for illustrating a configuration of a power conversion device according to a modified example of Embodiment 1.

FIG. 1A, FIG. 1B to FIG. 3 serve for explaining a configuration of a power conversion device according to Embodiment 1, in which FIG. 1A is a plan view of the power conversion device as viewed from its circuit board-side and FIG. 1B is a sectional view along an A-A line in FIG. 1A. Further, FIG. 2A is a perspective view of a semiconductor switching element for constituting the power conversion device, FIG. 2B is a perspective view of a terminal extension member, FIG. 2C is a perspective view of another terminal extension member according to a modified example, and FIG. 3 is a sectional view of a part of the circuit board, corresponding to a B-B line in FIG. 1A. In addition, FIG. 4 is a sectional view of a power conversion device according to a modified example, and corresponds to the A-A line in FIG. 1A.

It is noted that, in order to make clear the characteristic parts in this application, parts other than components related to the arrangement such as a semiconductor switching element, a circuit board, an insertion guide, a driving circuit (a pulse transformer and a portion therearound), etc., are omitted from being drawn. In the actual power conversion device, its outer circumference is covered by a housing. Further, in FIG. 1A, as well as in FIG. 5A to be used in Embodiment 2, a circuit board, wiring patterns, insertion guides and a body part of each of pulse transformers are drawn as if they are transparent, by using broken lines and dotted lines.

A power conversion device 1 according to Embodiment 1 is a DC-DC converter for converting an input DC power into a DC voltage as an intended voltage. Here, as shown in FIG. 1A, the power conversion device has, as primary-side configuration parts of a full bridge DC-DC converter, a first switching element 21 to a fourth switching element 24 (referred to as "semiconductor switching elements 2" when the first to fourth ones are to be described indistinctively). Further, as shown in FIG. 1B, the semiconductor switching elements 2 are each fixed to a fixing surface 7$fm$ of a housing 7 serving also as a cooling plate, and a circuit board 3 is located spaced apart from the fixing surface 7$fm$.

On an opposing surface (mounting surface 3$fm$) of the circuit board 3 relative to the housing 7, a first pulse transformer 41 and a second pulse transformer 42 (referred to as "pulse transformers 4" when the first and second ones are to be described indistinctively) are mounted, so that a driving circuit is formed with unshown driving ICs, etc. Further, the first switching element 21 to the fourth switching element 24 are electrically connected to the circuit board 3, respectively through a first terminal extension member 81 to a fourth terminal extension member 84 (referred to as "terminal extension members 8" when the first to fourth ones are to be described indistinctively).

The first switching element 21 is a high-side element in the left-side arm, the second switching element 22 is a low-side element in the left-side arm, the third switching element 23 is a high-side element in the right-side arm and the fourth switching element 24 is a low-side element in the right-side arm. As each of the semiconductor switching elements 2, a MOSFET (Metal-Oxide-Semiconductor Field Effect Transistor) is used.

However, instead of the MOSFET, an IGBT (Insulated Gate Bipolar Transistor) may be used. Further, the semiconductor switching element may be that which uses a so-called wide bandgap semiconductor material such as GaN (gallium nitride), SiC (silicon carbide), diamond or the like, which allows, unlike usual Si (silicon), high voltage operation, high speed driving and high temperature operation.

As shown in FIG. 2A, lead terminals 2$t$ projecting from a lateral side 2$s$ of each of the semiconductor switching elements 2 in a direction parallel to a major surface 2$f$, have been subjected to a forming process to be directed perpendicular to the major surface 2$f$, followed by cutting. Further, the semiconductor switching elements are each fixed to the housing 7 through an insulating member 6 and by way of a fixing member 7$s$ (screw) passing through a fixing hole 2$h$, and are located in two rows and two columns so that the lateral sides 2$s$ thereof (sides where the lead terminals 2$t$ are placed) are each directed outward in the vertical direction in FIG. 1A.

As shown in FIG. 2B, each of the terminal extension members 8 forms an elongated shape with a length L which runs from a bonding end 8$ej$ to be bonded to the lead terminal 2$t$ toward an insertion end 8$ep$ to be inserted into the circuit board 3, in which, at its middle portion, a deformation part 8$b$ curved in the thickness direction is formed by a bending process. Further, the bonding end 8$ej$ is bonded to a surface 2$tf$ subjected to the forming process in the lead terminal 2$t$ so that, at the time the semiconductor switching element 2 is fixed by soldering or welding to the housing 7, the insertion end 8$ep$ extends toward the circuit board 3. Note that, as will be described later, in order to establish a space for storing the pulse transformer 4, the length L is set according to a height H of the pulse transformer 4.

Thus, when the semiconductor switching elements 2 are fixed to the housing 7, the insertion ends 8$ep$ of the respective terminal extension members 8 project up to a specified height distant from the housing 7 by a length of L+α (depending on the position of the bonding end 8$ej$), and they are separated into groups at two vertical locations in FIG. 1A, each of the groups being aligned laterally. Meanwhile, on the mounting surface 3$fm$ of the circuit board 3, insertion guides 5 are provided in order to make it easier to establish electrical connections between the respective terminal extension members 8 and the circuit board 3 at the time of component assembly. Two insertion guides 5 are located to be separated vertically and to correspond to the respective groups of insertion ends 8$ep$ separated vertically and aligned laterally.

Thus, when the respective terminal extension members 8 are inserted along the insertion guides 5, unshown holes for electrical connection in the circuit board 3 and the respective semiconductor switching elements 2 are electrically connected to each other and also, the positional relationship between the housing 7 and the circuit board 3 is fixed. At the same time, on an area of the circuit board 3 sandwiched between the respective groups of terminal extension members 8, namely, on a central area of the opposing surface (mounting surface 3$fm$) relative to the fixing surface 7$fm$ of the housing 7, a space corresponding to the length L is created between the semiconductor switching elements 2 and the circuit board 3.

Because the space is thus established by the terminal extension members 8, the first pulse transformer 41 and the second pulse transformer 42 are mounted on the mounting surface 3$fm$ of the circuit board 3 in the area sandwiched between the insertion guides 5, to be aligned laterally in FIG. 1A. The first pulse transformer 41 is electrically connected to the driving IC, etc. in the driving circuit in such a manner that its input terminals 41$i$ projecting toward the second pulse transformer 42 are connected to wiring patterns 32$a$, 32$b$ (referred to collectively as wiring patterns 32) extending rightward from a central portion of the circuit board 3. Further, it is electrically connected to the first switching element 21 and the second switching element 22 in such a manner that its output terminals 41$xb$, 41$xc$ projecting outward are connected, respectively, to the wiring patterns 34$a$, 34$b$ and the wiring patterns 34$c$, 34$d$ (referred to collectively as wiring patterns 34).

Likewise, the second pulse transformer 42 is electrically connected to the driving IC, etc. in the driving circuit in such a manner that its input terminals 42$i$ projecting toward the first pulse transformer 41 are connected to wiring patterns 33$a$, 33$b$ (referred to collectively as wiring patterns 33) similarly extending rightward from the central portion of the circuit board 3. Further, it is electrically connected to the third switching element 23 and the fourth switching element 24 in such a manner that its output terminals 42xb, 42xc projecting outward are connected, respectively, to the wiring patterns 35a, 35b and the wiring patterns 35c, 35d (referred to collectively as wiring patterns 35).

Namely, with the provision of the terminal extension members 8, the pulse transformers 4, which are otherwise required to be located on a side of the circuit board 3 farther away from the housing 7 (upper side in FIG. 1B), can be provided between the circuit board 3 and the housing 7 (on the mounting surface 3fm). This makes it possible to decrease the void space ratio and to reduce the height (thickness), without impairing ease of assembly, to thereby achieve downsizing and cost reduction (material cost reduction due to reduced volume of the housing).

In addition, because the deformation part 8b curved in the thickness direction is provided in the terminal extension member 8, a stress due to displacement between the housing 7 and the circuit board 3 will be absorbed, so that the vibration resistance of the device can be ensured. This makes it possible, when, for example, the device is integrated with the inverter into one unit, to also satisfy the demand for its vibration resistance that is required but depending on the layout restriction of the inverter.

It is noted that the deformation part 8b is not limited to having the curved shape shown in FIG. 2B. For example, like in a terminal extension member 8 shown in FIG. 2C according to a modified example, it may be in a bent state. The terminal extension member, so far as at least a bending process for bending it in the thickness direction has been applied thereto, can absorb the stress due to displacement between the housing 7 and the circuit board 3, to thereby ensure the vibration resistance of the device.

It is noted that, even though it is not achievable to eliminate the terminal extension members 8 when the semiconductor switching element is a standard product, if a so-called custom-made semiconductor switching element 2 is used which is specially designed so that the length of each of the lead terminals 2t is increased to be matched with the height H of the pulse transformer, it is possible to eliminate the terminal extension members. Even in that case, the lead terminal, so far as a bending process, corresponding to that for the aforementioned deformation part 8b, for bending it in the thickness direction has been applied thereto, can absorb the stress due to displacement between the housing 7 and the circuit board 3, to thereby ensure the vibration resistance of the device.

Further, since the input terminals 41i and the input terminals 42i (referred to collectively as input terminals 4i) of the respective pulse transformers 4 project toward the inner side, they are located at positions that are nearer to the fixing members 7s (screws) of the semiconductor switching elements 2, than those of the output terminals 41xb, 41xc, 42xb, 42xc (referred to collectively as output terminals 4x). In order to ensure insulation performance of the device, it is required to establish an insulating distance between the components so that dielectric breakdown is prevented from occurring. Accordingly, insulation between the head of the screw and another component becomes an issue because the screw has one end portion that is ingrown in the housing 7 and the other end portion that projects from the major surface 2f of the semiconductor switching element 2 toward the circuit board, so that the head thereof has the same potential as that of the housing 7.

It is noted, however, that the input terminals 4i that are connected in the driving circuit as a low voltage system require less insulation distance to the housing 7 than the output terminals 4x connected to the semiconductor switching elements 2 in a high voltage system. For that reason, the input terminals 4i are located on the inner side. This does not require additional incorporation of an insulating member for the fixing member 7s (screw head), and thus makes it possible to further reduce the height of the device, so that further downsizing and cost reduction can be achieved.

As shown in FIG. 3, the circuit board 3 is a multi-layer board composed of four layers (a layer 3s1 to a layer 3s4). Note that, in the figure, illustration is made focusing on the positional relationships, and is thus drawn while appropriately changing the horizontal and vertical sizes. Here, description will be made about the positional relationship on the circuit board 3 between the wiring patterns 35a to 35d in the high voltage system and the wiring patterns 32, 33 in the low voltage system. In the horizontal direction in the figure, the wiring patterns 32a, 32b, 33a, 33b in the low voltage system are located to fall between the output terminals 42xb, 42xc of the second pulse transformer 42. Further, the wiring patterns 32, 33 in the low voltage system are located so that, when they are projected optically in the thickness direction, their images do not make an overlap (layer-to-layer) with those of the wiring patterns 35 in the high voltage system, namely, the respective sets of projected images on the mounting surface 3fm are apart from each other.

Further, the wiring patterns 35a, 35b, as well as the wiring patterns 35c, 35d, in the high voltage system, are located to make a layer-to-layer overlap with each other, and the wiring patterns 32a, 32b, 33a, 33b in the low voltage system are located to make a layer-to-layer overlap with each other. Further, the wiring patterns 34a to 34d in the high voltage system that are connected to the output terminals 41xb, 41xc of the first pulse transformer 41, are located similarly to those in FIG. 3 except that any wiring pattern in the low voltage system is not formed. This makes smaller the area of a current loop formed by the semiconductor switching elements 2 (Gates G, Sources S) and the driving circuit. Thus, it becomes possible to achieve improvement in noise immunity and further downsizing due to reduction of the areas of the wiring patterns.

Modified Example

In this modified example, description will be made on how to deal with noise caused by the operation of the semiconductor switching element. In a power conversion device 1 according to the modified example, as shown in FIG. 4, a flat shielding plate 9 made of a metal is provided to be spaced apart from the circuit board 3 on its surface side reverse to the mounting surface 3fm.

In a power conversion device, potential variation occurs due to ON-OFF operations of the semiconductor switching elements, so that noise is generated. The higher the mounting density, the larger the noise propagating from a noise source portion around the semiconductor switching elements becomes, and the more apparent the problem of erroneous operation becomes. As a method of solving that problem, such a method is employed in which a shielding plate made of a metal such as aluminum, iron or the like, is disposed over the noise source portion around the semiconductor switching elements.

However, when, as in the conventional case, the pulse transformers are located on a side of the circuit board farther away from the housing, the shielding plate has to be processed to be matched with the height H of each of the pulse transformers and in conformity with the shape of each of the pulse transformers. However, when, as in this application, the space is established by the terminal extension members 8 and the pulse transformers 4 are mounted on the mounting surface 3*fm*-side, it is avoided to make the shielding plate 9 matched with the height H and the shape of each of the pulse transformers 4. Thus, such an extra process becomes unnecessary, so that it is possible to achieve downsizing and cost reduction.

Embodiment 2

Figure 5A:
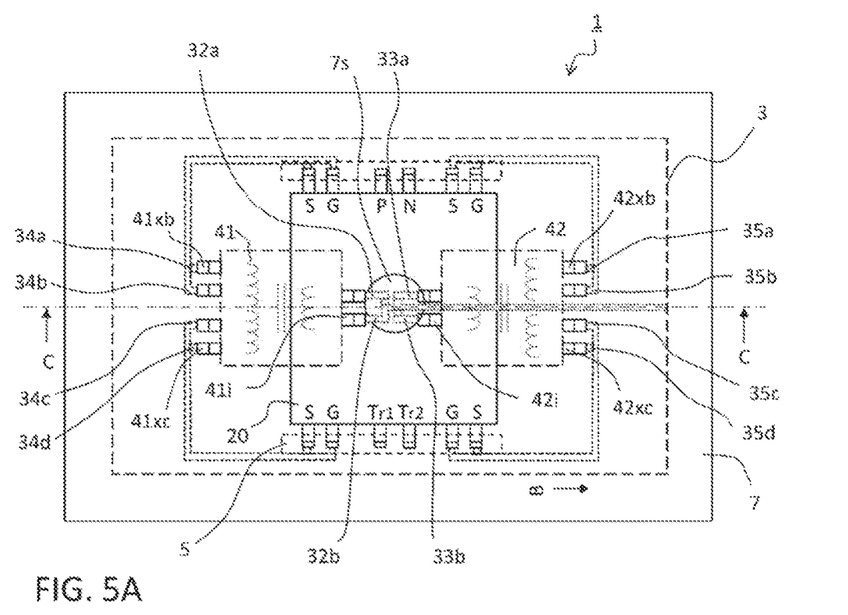
FIG. 5A and FIG. 5B are a plan view and a sectional view for illustrating a configuration of a power conversion device according to Embodiment 2.
Figure 5B:
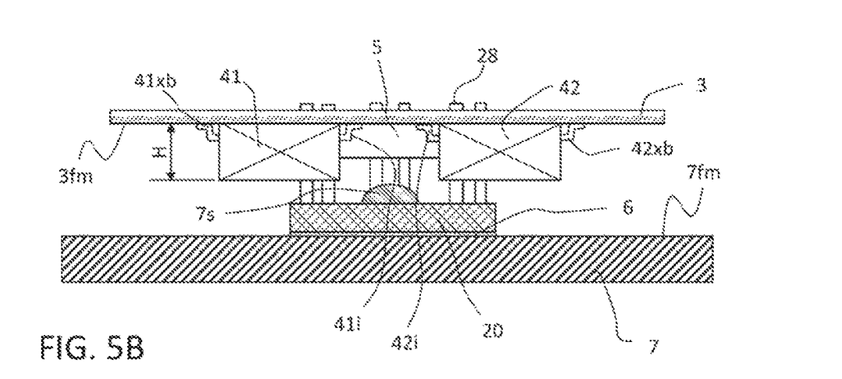

In Embodiment 1, a case has been described where the semiconductor switching elements are individually fixed to the housing; however, this is not limitative. In Embodiment 2, a case will be described where a module is used in which four semiconductor switching elements are integrally molded. FIG. 5A and FIG. 5B serve for explaining a configuration of a power conversion device according to Embodiment 2, in which FIG. 5A is a plan view of the power conversion device as viewed from its circuit board-side and FIG. 5B is a sectional view along a C-C line in FIG. 5A. Except for the integration of the semiconductor switching elements, positional changes of the terminals caused by the integration, etc., the power conversion device is the same as that in Embodiment 1. Thus, FIG. 2A, FIG. 2B and FIG. 3 used in Embodiment 1 are also employed here, and description of the same parts will be omitted.

In a power conversion device 1 according to Embodiment 2, as shown in FIG. 5A and FIG. 5B, the first to fourth switching element 21 to 24 and the first to fourth terminal extension members 81 to 84, that have been described in Embodiment 1, are replaced with a module 20 in which these switching elements and these terminal extension members are integrally molded. Here, in the module 20, the drain D of the first switching element 21 and the drain D of the third switching element 23 are wired together, and the source S of the second switching element 22 and the source S of the fourth switching element 24 are wired together. Likewise, in the module 20, the source S of the first switching element 21 and the drain D of the second switching element 22 are wired together, and also the source S of the third switching element 23 and the drain D of the fourth switching element 24 are wired together.

Further, terminals 28 of the module 20 for the sources D and gates G, have been subjected to a forming process corresponding to that for the lead terminals 2*t* described in Embodiment 1, and each have a length corresponding to the length L of the terminal extension member 8. Thus, when the module 20 is fixed to the housing 7, insertion ends of the terminals corresponding to the insertion ends 8*ep*, project up to a specified height distant from the housing 7 by a length of L+α, and they are separated into groups at two vertical locations in FIG. 5A, each of the groups being aligned laterally. Like in Embodiment 1, two insertion guides 5 are also located to be separated vertically and to correspond to the respective groups of insertion ends separated vertically and aligned laterally. At the time of the assembly, the insertion ends are inserted in the insertion guides 5, so that electrical connections between the module 20 and the circuit board 3 are established.

On the other hand, the drain D of the first switching element 21 and the drain D of the third switching element 23 are brought out of the module 20 as terminals (P and N) to be connected to the input side of the DC-DC converter. Likewise, the source S of the second switching element 22 and the source S of the fourth switching element 24 are also brought out of the module 20 as the terminals (P and N).

Furthermore, the wiring connected between the source S of the first switching element 21 and the drain D of the second switching element 22 is brought out of the module 20 as terminals (Tr1 and Tr2) to be connected to the output side of the DC-DC inverter. Likewise, the wiring connected between the source S of the third switching element 23 and the drain D of the fourth switching element 24 is also brought out of the module 20 as the terminals (Tr1 and Tr2).

The other configuration elements are the same as those in Embodiment 1. In Embodiment 2, at the time of the formation of the module, the terminals 28 are formed to have a function similar to that of the terminal extension members 8, so that it becomes possible to provide the pulse transformers 4 on the mounting surface 3*fm* of the circuit board 3. This makes it possible to decrease the void space ratio and to reduce the height (thickness), without impairing ease of assembly, to thereby achieve downsizing and cost reduction (material cost reduction due to reduced volume of the housing).

It is noted that, in Embodiment 1, wiring connections between the drains D and the sources S of the first to fourth switching elements 21 to 24 have to be taken on the circuit board 3-side. However, according to Embodiment 2, the wiring connections can be taken on the module 20-side. This makes it possible to reduce the projected area of the circuit board 3, and thus to achieve further downsizing of the device.

It should be noted that, in this application, exemplary embodiments have been described; however, every characteristic, configuration or function that has been described in the embodiments, is not limited to being applied to a specific embodiment, and may be applied singularly or in any of various combinations thereof to another embodiment. Accordingly, an infinite number of modified examples that have been not exemplified here are supposed within the technical scope disclosed in the present description. For example, such cases shall be included where at least one configuration element is modified and where at least one configuration element is added or omitted.

For example, in Embodiment 1 and Embodiment 2, cases have been described where the power conversion device is a full bridge DC-DC converter; however, this is not limitative. Even when the power conversion device is a half bridge DC-DC converter which is configured with the first switching element 21, the second switching element 22 (paired semiconductor switching elements 2) and the first pulse transformer 41, an effect similar to the above will be achieved.

Furthermore, cases have been described where the power conversion device is a DC-DC converter; however, this is not limitative. The power conversion device may be other than a DC-DC converter, so far as it is a power conversion device which uses: a circuit board 3 on which a driving circuit having a pulse transformer 4 is formed; semiconductor switching element 2 whose major surfaces 2*f* are fixed to the surface of a housing 7 opposite to the circuit board 3; and insertion guides 5.

As described above, the power conversion device 1 of this application comprises: the semiconductor switching elements 2 each forming a plate shape, which are paired to form a bridge for power conversion; the housing 7 having the fixing surface 7*fm* to which one of the major surfaces 2*f* of each of the semiconductor switching elements 2 is fixed; the circuit board 3 on which a driving circuit for driving the semiconductor switching elements 2 is mounted and which is located opposite to and spaced apart from the fixing surface 7*fm*; the insertion guides 5 which are disposed on an opposing surface (mounting surface 3*fm*) of the circuit board 3 relative to the fixing surface 7*fm*; and the elongated terminal extension members 8 each having the length L that is matched with the height H of the pulse transformer 4 that serves to form the driving circuit, in which the bonding ends 8*ej* as their one ends are bonded to the respective lead terminals 2*t* of the semiconductor switching elements 2 that are projecting from one lateral sides 2*s* thereof, and the insertion ends 8*ep* as their other ends extend toward the insertion guides 5; wherein the pulse transformer 4 is disposed on the opposing surface (mounting surface 3*fm*) so as to be opposite to the other one of the major surfaces 2*f* of each of the semiconductor switching elements 2. Accordingly, the circuit board 3 can easily be combined with the semiconductor switching elements 2 fixed to the housing 7. At the same time, because of the gap created according to the length L of the terminal extension member 8, the pulse transformer 4 can be mounted on the mounting surface 3*fm* opposite to the fixing surface 7*fm*, so that no wasteful space is produced. Thus, it is possible to provide a power conversion device which has ease of assembly and can be downsized.

At the same time, in the terminal extension member 8 and at the middle of its portion extending toward the insertion guide 5, the deformation part 8*b* deformed in the thickness direction is formed. This absorbs vibrations to thereby improve the vibration resistance.

In another aspect, as described above, the power conversion device 1 of this application comprises: the semiconductor switching elements 2 each forming a plate shape, which are paired to form a bridge for power conversion; the housing 7 having the fixing surface 7*fm* to which one of the major surfaces 2*f* of each of the semiconductor switching elements 2 is fixed; the circuit board 3 on which a driving circuit for driving the semiconductor switching elements 2 is mounted and which is located opposite to and spaced apart from the fixing surface 7*fm*; and the insertion guides 5 which are disposed on an opposing surface (mounting surface 3*fm*) of the circuit board 3 relative to the fixing surface 7*fm*; wherein the respective lead terminals 2*t* of the semiconductor switching elements 2 that are projecting from one lateral sides 2*s* thereof, each have a length (corresponding to the length L) that is matched with the height H of the pulse transformer 4 that serves to form the driving circuit, and extend toward the insertion guides 5; and wherein the pulse transformer 4 is disposed on the opposing surface (mounting surface 3*fm*) so as to be opposite to the other one of the major surfaces 2*f* of each of the semiconductor switching elements 2. Accordingly, the circuit board 3 can easily be combined with the semiconductor switching elements 2 fixed to the housing 7. At the same time, because of the gap created according to the length of the lead terminal 2*t*, the pulse transformer 4 can be mounted on the mounting surface 3*fm* opposite to the fixing surface 7*fm*, so that no wasteful space is produced. Thus, it is possible to provide a power conversion device which has ease of assembly and can be downsized.

At the same time, in the lead terminal 2*t* and at the middle of its portion extending toward the insertion guide 5, the deformation part deformed in the thickness direction is formed. This absorbs vibrations to thereby improve the vibration resistance.

In particular, when the power conversion device is configured so that: the semiconductor switching elements 2 are located side-by-side in one row so that their respective lateral sides reverse to said one lateral sides 2*s* on which the lead terminals 2*t* are formed, are opposite to each other; and the pulse transformer 4 is located on the circuit board 3 so that its surface on which the input terminals 4*i* that make electrical connections in the driving circuit are provided, and its surface on which the output terminals 4*x* electrically connected to the semiconductor switching elements 2 are provided, are directed reversely to each other in the direction perpendicular to the row of the semiconductor switching elements 2, it is possible to perform wiring easily while avoiding interference between the terminals of the pulse transformer 4 and the respective lead terminals 2*t* of the semiconductor switching elements 2 (as well as the respective terminal extension members 8).

Further, when, on the fixing surface 7*fm*, two pairs of the semiconductor switching elements 2 are located side-by-side in two rows and, on the circuit board 3, two pulse transformers 41, 42 are located correspondingly to said two pairs and side-by-side in a direction perpendicular to each one of the rows (also, in a direction parallel to the mounting surface 3*fm*), it is possible, even though the semiconductor switching elements are located in two rows and two columns, to perform wiring easily while avoiding interference between the respective terminals of the pulse transformers 4 and the respective lead terminals 2*t* of the semiconductor switching elements 2 (as well as the respective terminal extension members 8).

In addition to the above, when the fixing members 7*s* each having one end portion ingrown in the housing 7 and another end portion (screw head) protruding from the other one of the major surfaces 2*f* toward the circuit board 3, are provided for fixing the respective semiconductor switching elements 2 to the fixing surface 7*fm*, and when the two pulse transformers 41, 42 are located so that their surfaces on which the input terminals 4*i* are provided are opposite to each other, it becomes unnecessary to incorporate an additional insulating member for the input terminals 4*i* that are nearer to the screw heads than the output terminals 4*x* because, unlike the output terminals 4*x*, the input terminals 4*i* are terminals in the low voltage system.

The circuit board is a multi-layer board in which multiple layers are stacked in the thickness direction, and the wiring patterns 32, 33 electrically connected to the input terminals 4*i* are located so that the images thereof projected along the thickness direction are apart from those of the wiring patterns (or 34) electrically connected to the output terminals 4*x*. Thus, it becomes possible to both achieve improvement in noise immunity and reduction of the areas of the wiring patterns.

when the power conversion device is provided with the shielding plate 9 located on the reverse side of the opposing surface (mounting surface 3*fm*), a flat shielding plate 9 can be placed there without the need of being formed into a shape matched with the pulse transformer 4, for example, and without creating too much space.

When the multiple semiconductor switching 2 are integrated together as the module 20 (in some cases, together also with the terminal extension members 8), it is possible to reduce the steps for wiring and to achieve downsizing.

What is claimed is:
1. A power conversion device, comprising:
  semiconductor switching elements each forming a plate shape, which are paired to form a bridge for power conversion;
  a housing having a fixing surface to which one of major surfaces of each of the semiconductor switching elements is fixed;

a circuit board on which a driving circuit for driving the semiconductor switching elements is mounted and which is located opposite to and spaced apart from the fixing surface; and insertion guides which are disposed on an opposing surface of the circuit board relative to the fixing surface;

wherein respective lead terminals of the semiconductor switching elements that are projecting from one lateral sides thereof, each have a length that is matched with a height of a pulse transformer that serves to form the driving circuit, and extend toward the insertion guides; and wherein the pulse transformer is disposed on the opposing surface so as to be opposite to the other one of the major surfaces of each of the semiconductor switching elements.

2. The power conversion device of claim 1, wherein, in the lead terminal and at a middle of its portion extending toward the insertion guide, a deformation part deformed in a thickness direction of that terminal is formed.

3. The power conversion device of claim 1, wherein the semiconductor switching elements are located side-by-side in one row so that their respective lateral sides reverse to said one lateral sides are opposite to each other; and wherein the pulse transformer is located on the circuit board so that its surface on which input terminals that make electrical connections in the driving circuit are provided, and its surface on which output terminals electrically connected to the semi-conductor switching elements are provided, are directed reversely to each other in a direction perpendicular to said one row.

4. The power conversion device of claim 2, wherein the semiconductor switching elements are located side-by-side in one row so that their respective lateral sides reverse to said one lateral sides are opposite to each other; and wherein the pulse transformer is located on the circuit board so that its surface on which input terminals that make electrical connections in the driving circuit are provided, and its surface on which output terminals electrically connected to the semi-conductor switching elements are provided, are directed reversely to each other in a direction perpendicular to said one row.

5. The power conversion device of claim 3, wherein, on the fixing surface, two pairs of said semiconductor switching elements are located side-by-side in two rows; and wherein, on the circuit board, two pulse transformers each being said pulse transformer are located correspondingly to said two pairs and side-by-side in a direction perpendicular to said one row.

6. The power conversion device of claim 5, further comprising fixing members each having one end portion ingrown in the housing and another end portion protruding from said other one of the major surfaces toward the circuit board, for fixing the respective semiconductor switching elements to the fixing surface; wherein the two pulse transformers are located so that their respective surfaces on which the input terminals are provided, are opposite to each other.

7. The power conversion device of claim 3, wherein the circuit board is a multi-layer board in which multiple layers are stacked in a thickness direction of that board; and wherein wiring patterns electrically connected to the input terminals are located so that images thereof projected along the thickness direction are apart from those of wiring patterns electrically connected to the output terminals.

8. The power conversion device of claim 4, wherein the circuit board is a multi-layer board in which multiple layers are stacked in a thickness direction of that board; and wherein wiring patterns electrically connected to the input terminals are located so that images thereof projected along the thickness direction are apart from those of wiring patterns electrically connected to the output terminals.

9. The power conversion device of claim 1, further comprising a shielding plate located on a reverse side of the opposing surface.

10. The power conversion device of claim 1, wherein the multiple semiconductor switching elements are integrated together as a module.

11. A power conversion device, comprising:

semiconductor switching elements each forming a plate shape, which are paired to form a bridge for power conversion;

a housing having a fixing surface to which one of major surfaces of each of the semiconductor switching elements is fixed;

a circuit board on which a driving circuit for driving the semiconductor switching elements is mounted and which is located opposite to and spaced apart from the fixing surface;

insertion guides which are disposed on an opposing surface of the circuit board relative to the fixing surface; and one of: (a) elongated terminal extension members each having a length that is matched with a height of a pulse transformer that serves to form the driving circuit, one ends of which are bonded to respective lead terminals of the semiconductor switching elements that are projecting from one lateral sides thereof, and the other ends of which extend toward the insertion guides; and (b) respective lead terminals of the semiconductor switching elements that are projecting from one lateral sides thereof, each having a length that is matched with a height of a pulse transformer that serves to form the driving circuit, and extend toward the insertion guides; and wherein the pulse transformer is disposed on the opposing surface so as to be opposite to the other one of the major surfaces of each of the semiconductor switching elements.

* * * * *